US007703823B2

(12) United States Patent
Harless et al.

(10) Patent No.: US 7,703,823 B2
(45) Date of Patent: Apr. 27, 2010

(54) WAFER HOLDING MECHANISM

(75) Inventors: Mark Harless, Plymouth, MN (US);
Cory Watkins, Eden Prairie, MN (US);
Pat Simpkins, Edina, MN (US); Kevin Barr, Inver Grove Heights, MN (US)

(73) Assignee: Rudolph Technologies, Inc., Flanders, NJ (US)

(*) Notice: Subject to any disclaimer, the term of this patent is extended or adjusted under 35 U.S.C. 154(b) by 1230 days.

(21) Appl. No.: 11/179,058

(22) Filed: Jul. 11, 2005

(65) Prior Publication Data
US 2006/0046396 A1    Mar. 2, 2006

Related U.S. Application Data

(60) Provisional application No. 60/587,571, filed on Jul. 12, 2004.

(51) Int. Cl.
*B65G 49/07* (2006.01)

(52) U.S. Cl. .................. 294/103.1; 118/503; 414/941

(58) Field of Classification Search .................. 414/783, 414/936, 941; 294/103.1
See application file for complete search history.

(56) References Cited

U.S. PATENT DOCUMENTS

| 5,037,262 | A | * | 8/1991 | Moll et al. ............. 414/222.04 |
|---|---|---|---|---|
| 5,100,502 | A | * | 3/1992 | Murdoch et al. ......... 414/744.1 |
| 5,513,594 | A | * | 5/1996 | McClanahan et al. ....... 118/503 |
| 5,534,110 | A | * | 7/1996 | Lenz et al. .................. 438/716 |
| 5,578,167 | A | * | 11/1996 | Sooriakumar et al. ....... 438/745 |
| 5,954,072 | A | * | 9/1999 | Matusita ..................... 134/149 |
| 6,540,014 | B2 | * | 4/2003 | Getchel et al. ............. 165/80.1 |
| 6,761,362 | B2 | * | 7/2004 | Noguchi ..................... 279/106 |
| 6,793,258 | B2 | * | 9/2004 | Gray ....................... 294/103.1 |
| 6,866,468 | B2 | * | 3/2005 | Moller et al. ............... 414/783 |
| 7,284,760 | B2 | * | 10/2007 | Siebert et al. ............. 279/4.12 |
| 7,354,335 | B2 | * | 4/2008 | Marquardt et al. ............ 451/11 |
| 7,413,628 | B2 | * | 8/2008 | Shimbara et al. ....... 156/345.55 |
| 2002/0005166 | A1 | * | 1/2002 | Kisaichi ..................... 118/503 |

* cited by examiner

Primary Examiner—James Keenan
(74) Attorney, Agent, or Firm—Dicke, Billig & Czaja, PLLC

(57) ABSTRACT

A wafer holding mechanism for holding a wafer of the type used in the manufacture of semiconductor devices is herein described. The mechanism has a first plate having a number of offsets that define at least one lip that extends radially inward of the offsets. A second plate is positioned adjacent the first plate and generally between the first plate and the lip such that one or more fingers coupled to the second plate oppose the lip that depends from the first plate. When the second plate is moved to a closed position, the at least one lip and the one or more fingers cooperatively grasp an edge of a wafer therebetween. The wafer holding mechanism is coupled to a drive that rotates the wafer before an imaging mechanism for capturing images of the wafer as it rotates.

27 Claims, 7 Drawing Sheets

WAFER HOLDING MECHANISM

CROSS-REFERENCE TO RELATED APPLICATION

This is application is related to and claims priority from U.S. provisional application Ser. No. 60/587,571 filed Jul. 12, 2004 and hereby incorporated by reference.

TECHNICAL FIELD OF THE INVENTION

The present invention relates generally to a mechanism for grasping a discoid object and more particularly to a mechanism for securing and manipulating a disc-shaped wafer of a type used in the fabrication of semiconductor and microelectronic devices.

BACKGROUND OF THE INVENTION

With near exponential growth in the use of microelectronics in virtually all sectors of our economy and in our personal lives, demand for integrated circuits and semiconductor devices has grown quickly. In order to keep up, manufacturers have striven to continuously boost their manufacturing capacity to meet the ever-increasing demand for goods that incorporate microelectronic devices.

In order to increase their yield, i.e. the percentage of useable microelectronic devices output by their fabrication facilities, and to further increase the quality of their goods, manufacturers have increasingly turned to automated inspection processes and methods to assist them in identifying defective microelectronic devices and in determining the root causes of the identified defects. Using these automated inspection methods has effectively increased production capacity by allowing manufacturers to ensure that a larger percentage of the products produced is useable. The higher quality of the resulting goods also helps the manufacturers by assisting them in maintaining and/or increasing their revenue by making their products more desirable.

In addition to inspecting the microelectronic devices themselves, there is a growing trend toward inspecting the back side and edges of the silicon wafers on which microelectronic devices are fabricated. Inspection of the backside of the wafers on which the microelectronic devices are fabricated can identify defects in the wafer itself or in the microelectronic devices on the obverse side of the wafer. Identifying defects on the backside of a wafer allows a manufacture to catch problems earlier in the fabrication process and can help pinpoint problems in the fabrication process itself that may be solved so as to increase the yield for future device manufacturing.

One problem with current backside inspection systems emanates from the fact that the front side of a wafer has delicate structures formed thereon that do not allow for superfluous manipulation of the wafer. It is entirely too easy to damage or destroy a valuable wafer and the microelectronic devices formed thereon. This danger is further complicated by the fact that the only locations on a wafer that may be positively grasped by a manipulator are the edges of the wafer. Generally, manufacturers allow for an edge exclusion zone around the periphery of the wafer that is between 3 and 10 mm in width, though these dimensions often vary between manufacturers and applications.

One existing system used in the wafer inspection industry is described in U.S. Pat. No. 6,204,917. This device includes a set of grooved wheels to rotate the wafer on an air bearing surface while a camera is inspecting the front side and back side at the same time. One problem with this design is that edge rolling of the wafer to spin it can create particles that will contaminate the surfaces of the wafer. Another problem with this design is that it is difficult to accurately predict the rotation angle of the wafer because the rolling contact with the edge could slip.

Other systems utilize known imaging methods in conjunction with a three-axis robotic device or manipulator that rotates the wafer about three orthogonal axes generally referred to as X, Y and Z. An example of one such system is the INS 3300 marketed by Leica Microsystems of Wetzlar, Germany. This system uses a robot to manipulate the wafer during inspection. Because wafers do flex somewhat as a result of such manipulation, it is possible to damage the wafer itself and/or the microelectronic structures formed thereon, and such manipulations are therefore disfavored by many manufacturers.

Accordingly, there is a need for a wafer handling system that minimizes stress placed on a wafer, while allowing clear access to the backside of the wafer for inspection.

DETAILED DESCRIPTION

Figure 1:
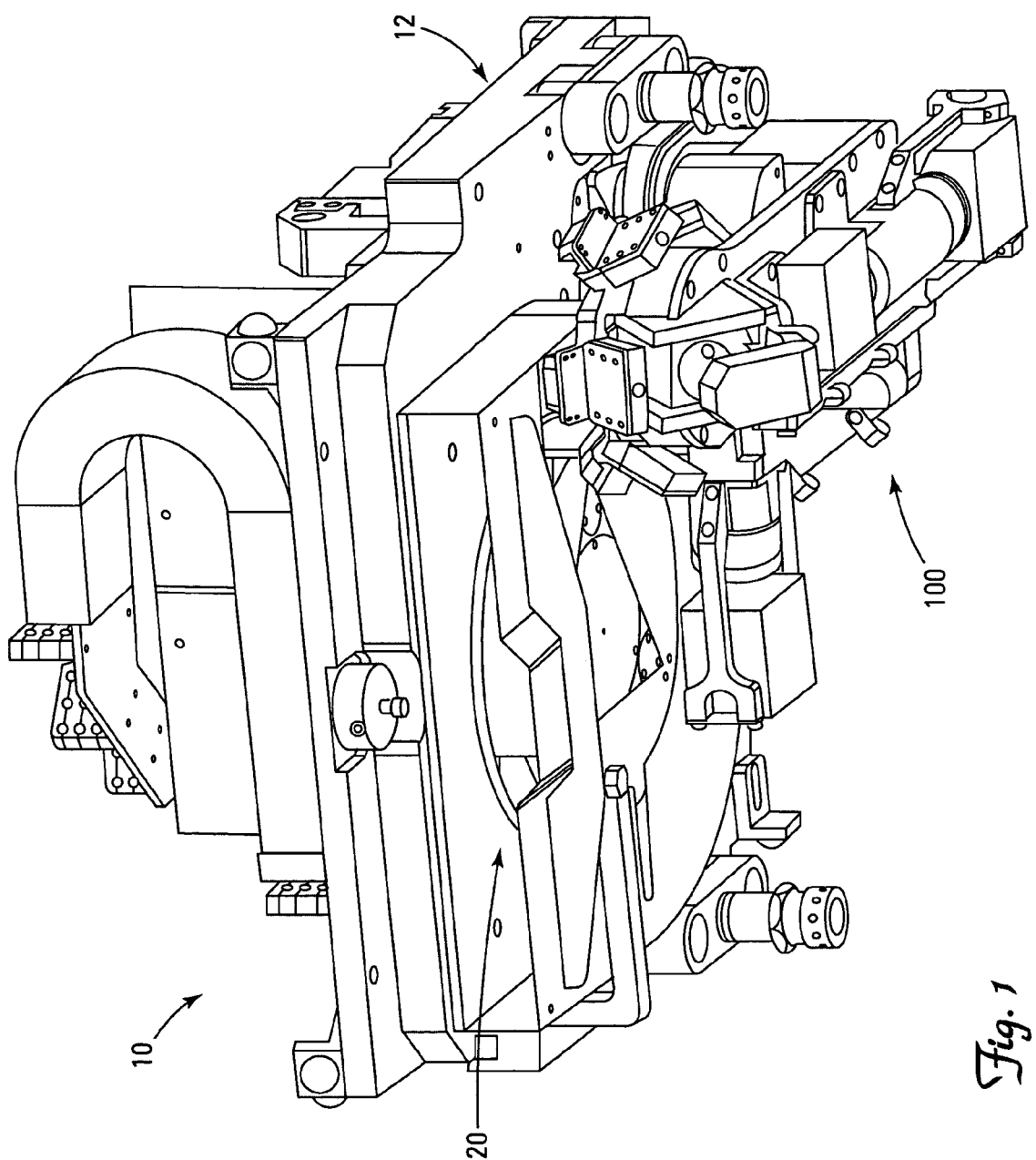
FIG. 1 is a perspective view of a wafer inspection system that includes a wafer holding mechanism according to one embodiment of the invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Turning first to FIG. 1, there can be seen one embodiment of a wafer backside inspection system 10. The system 10 includes a wafer holding mechanism 20 for gripping and moving a wafer W relative to an imaging mechanism 100 for capturing images of the backside of the wafer W, both of which are in this embodiment mounted on a frame or chassis 12. In one embodiment, wafer holding mechanism 20 rotates about vertical axis while in other embodiments, the wafer holding mechanism is coupled to a moveable stage (not shown) adapted to move the wafer holding mechanism linearly in an X direction, a Y direction, and/or a Z direction. In still other embodiments, the wafer holding mechanism may be mounted to a moveable stage having up to four degrees of freedom, e.g. linear movement in the X, Y, and/or Z directions and/or rotation about one or more axes.

Figure 2:
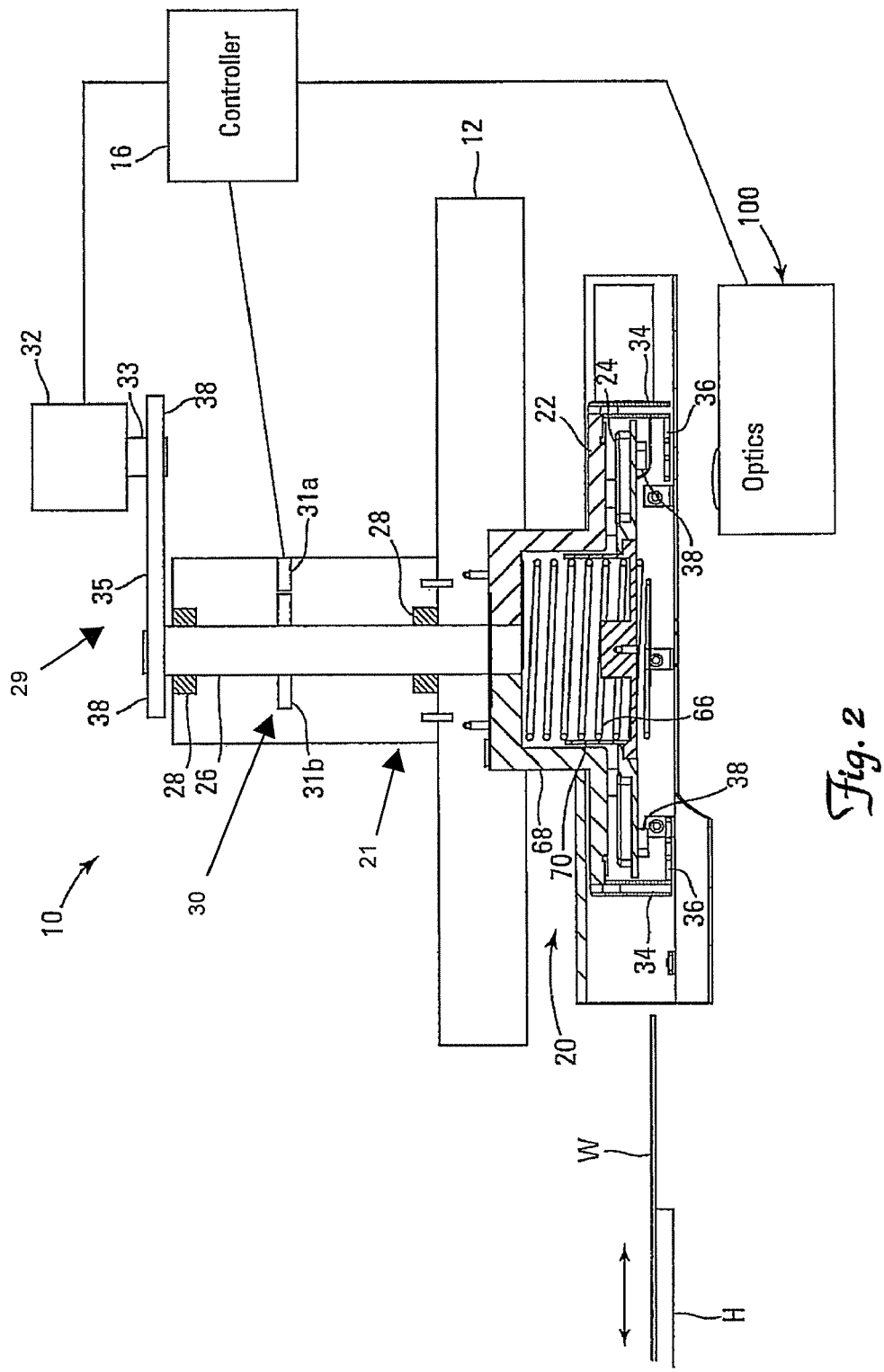
FIG. 2 is a schematic cross-sectional elevation of an embodiment of a wafer holding mechanism wherein the wafer clamping mechanism is arranged to receive a wafer, the wafer clamping mechanism being shown in relation to an imaging mechanism for imaging an undersurface of the wafer.
Figure 3:
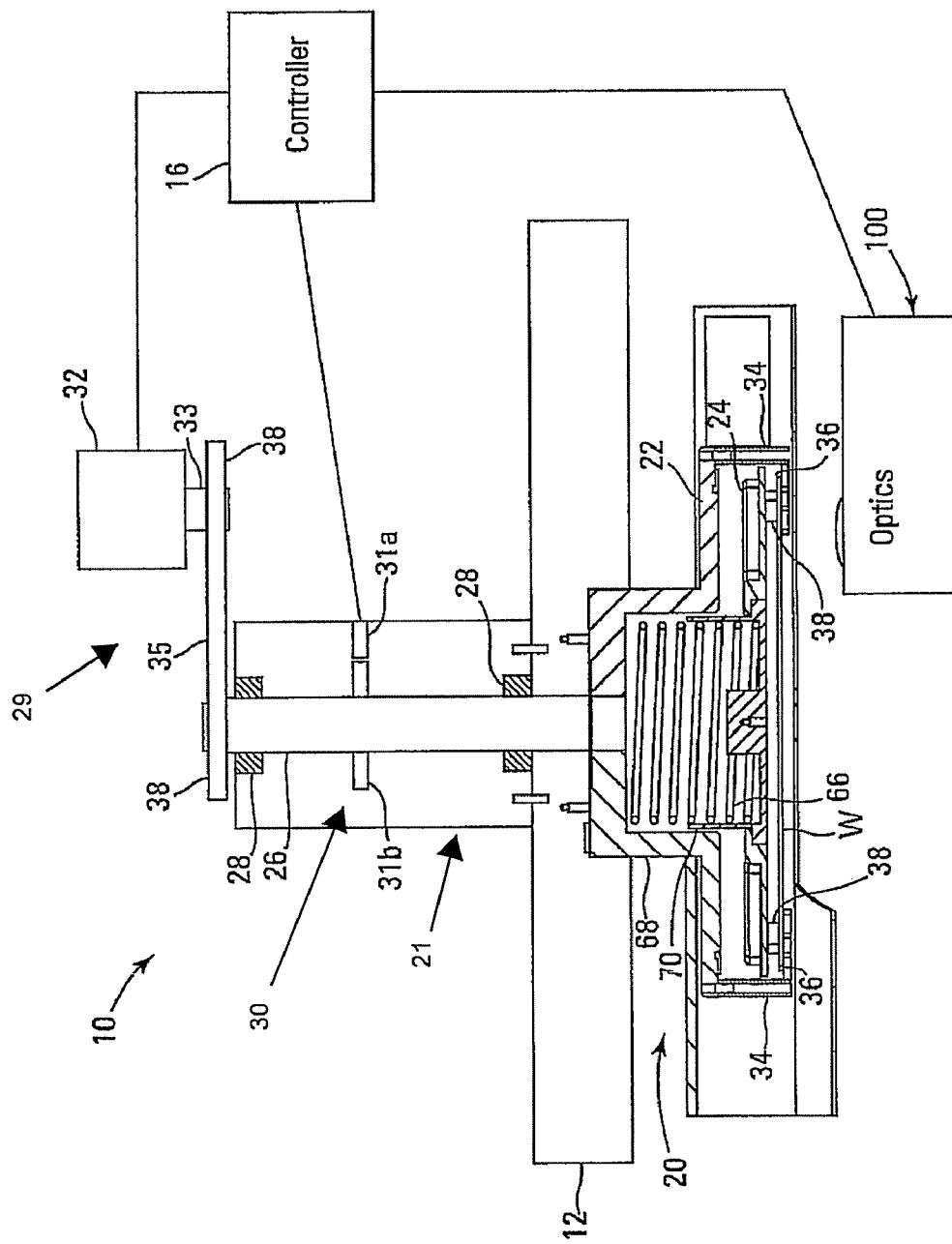
FIG. 3 is a schematic cross-sectional elevation of the wafer holding mechanism of FIG. 2 wherein the wafer holding mechanism is shown clamping a wafer.
Figure 4:
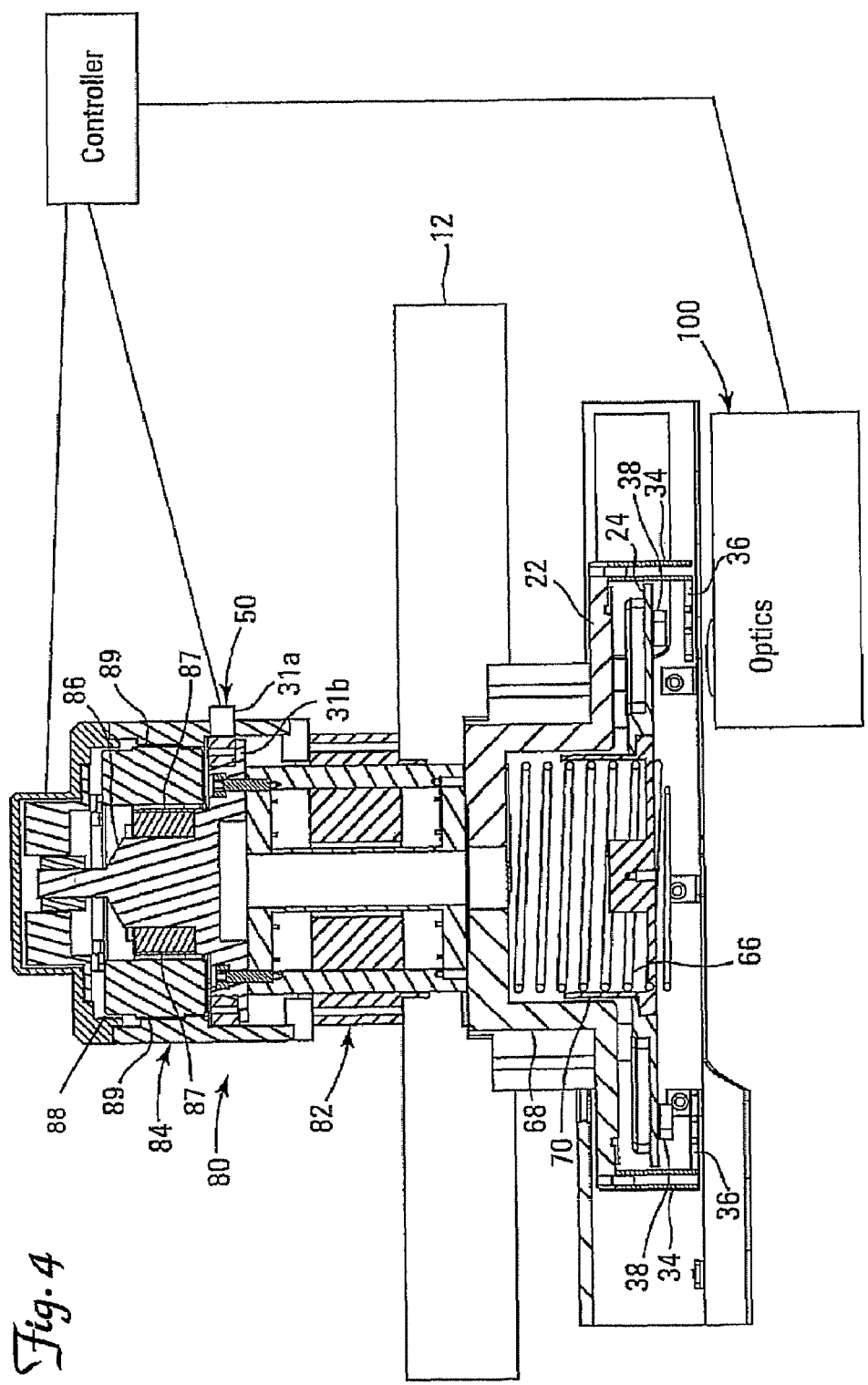
FIG. 4 is a schematic cross-sectional view of another embodiment of the wafer holding mechanism in which a brushless electric motor is coupled to the wafer holding mechanism by means of an air bearing the supports the wafer holding mechanism.

Wafers W are introduced to, and removed from, the wafer holding mechanism 20 by a wafer handler H, an operator, or another mechanism of a type known to those skilled in the art. The presentation of a wafer W to the system 10 is presented schematically in FIG. 2. While the wafer holding mechanism 20, the imaging mechanism 100 and the wafer handler may be operated in a stand-alone manual mode, it is to be understood that in most embodiments, these mechanisms will be communicatively coupled to one or more controllers 16 as illustrated in FIGS. 2-4, which act, preferably in concert, to orchestrate the movement of wafers W into the wafer inspection system 10, the clamping or gripping of the wafers W by the wafer holding mechanism 20, the imaging of at least one of the undersurface and top of the wafers W by the imaging system 100 and the removal of imaged wafers W from the system 10. Software running on the one or more controllers 16 will, in some embodiments, inspect the images of the backsides of wafers W for defects and the like, reporting those defects to additional software or to an operator for appropriate assessment.

FIG. 2 shows a cross-section of one embodiment of a wafer holding mechanism 20 taken vertically along a plane parallel to an axis of revolution of the mechanism 20. The mechanism 20 includes an upper plate 22 and a lower plate 24 that work cooperatively to gently, but securely, clamp wafers W therebetween as best seen in FIG. 3. In some embodiments, the wafer holding mechanism 20 rotates with a wafer W clamped therein to present the backside of the wafer W to an imaging mechanism 100, which captures one or more images of the backside of the wafer W for purposes of inspection. In other embodiments, the wafer holding mechanism 20 does not rotate, but rather clamps a wafer W therebetween as the imaging mechanism 100 is moved in relation to the backside of the wafer W to capture the desired images thereof.

In FIG. 2, upper and lower plates 22, 24 are positioned away from each other in an open, wafer receiving position in which wafers W may be inserted into and removed from, the space between the plates 22, 24. Upper plate 22 is in some embodiments vertically fixed, that is, it does not move vertically relative to the chassis 12 of system 10. In these embodiments, the lower plate 24 moves relative to the upper plate 22. It is to be understood that the wafer holding mechanism may also work where an upper plate 22 moves relative to a stationary lower plate 24.

In some embodiments, the upper and lower plates 22, 24 are coupled to a drive mechanism 29 that rotates the plates with respect to the imaging mechanism 100. In one particular embodiment best seen in FIGS. 2 and 3, the plates 22 and 24 are supported by a mechanical support 21 that couples the plates 22 and 24 to the chassis 12 and which also provides means for coupling the plates 22 and 24 to a source of motive power for rotating the plates.

In the embodiment of FIGS. 2 and 3, plate 22 is coupled to a shaft 26 of the mechanical support 21. The shaft 26 extends generally normally from the upper surface of the upper plate 22 and is preferably arranged generally concentrically with the plate such that the shaft and plate rotate together about the same axis of rotation. The shaft 26 of the mechanical support 21 is rotatively coupled, as by bearings 28, to the chassis 12. Bearings 28 may be of any useful type, such as ball or roller bearings. However, it is to be understood that bearings 28 not only provide a means for enabling the rotation of the shaft 26 and the upper plate 22, but that the bearings 28 may, in some embodiments, also limit the vertical travel of the shaft and upper plate. In one embodiment, a slight interference or press fit between the bearings 28 and the shaft 26 and between the bearings 28 and the chassis 12 will be sufficient to limit vertical travel of the shaft 26. In other embodiments, a thrust bearing (not shown) may be used to limit the vertical travel of the shaft 26.

A rotary encoder 30 is coupled between the shaft 26 and the chassis 12 to ensure that the radial position of the shaft 26, and hence that of the wafer W, is precisely known. In one embodiment the rotary encoder 30 is a magnetic rotary encoder, though it is to be understood that an optical rotary encoder or any other useful type of rotary encoder known to those skilled in the art may be utilized to sense and output the radial orientation of the shaft 26. In FIG. 2, a read head 31a of the rotary encoder 30 is positioned adjacent the shaft 26 such that the read head 31a addresses an encoding strip 31b attached to the shaft 26. As the encoding strip 31b moves past the read head 31a as the shaft 26 rotates, the read head 31a outputs data that directly or indirectly gives the radial position of the shaft, and hence the wafer W.

The drive 29 further includes a power source or motor 32 that is coupled to the mechanical support 21 and particularly to the shaft 26 thereof. The motor 32 is adapted to rotate the shaft 26 and hence, the wafer holding mechanism 20. An output 33 of the motor 32 of the drive 29 may be coupled to the shaft 26, as in the embodiment of FIG. 2, by means of a belt, a chain, or a geared transmission, all of which are figuratively represented by a belt 35 passed around pulleys or sheaves 38. Appropriate guarding or shielding (not shown) may be included around the belt 34.

As described above, in one embodiment of the wafer holding mechanism 20, the upper plate 22 is coupled to the shaft 26 and is therefore fixed in its vertical position. The lower plate 24, on the other hand, is adapted to move relative to the upper plate 22 so as to selectively grip and release a wafer W. As seen in FIG. 2, the lower plate 24 is in an upper, open position in which the lower plate 24 is positioned closer to the upper plate 22. In FIG. 3, the lower plate 24 is shown in a lower, closed position in which the lower plate is positioned farther from the upper plate 22. Upper plate 22 has secured to its periphery, a number of spacers 34. The spacers 34 extend downward away from the upper plate 22 to define a generally cylindrical space therebetween, though it should be understood that in other embodiments, the spacers 34 themselves may have any useful shape and accordingly may form spaces having other general shapes as well. Each of the spacers 34 has a lip 36 that extends radially inward. The lips 36 of the spacers 34 oppose the lower plate 24 and define a lower limit of the travel of the lower plate. Wafers W are clamped between the lower plate 24 and the lips 36 of the spacers 34 that extend from the upper plate 22.

Figure 6:
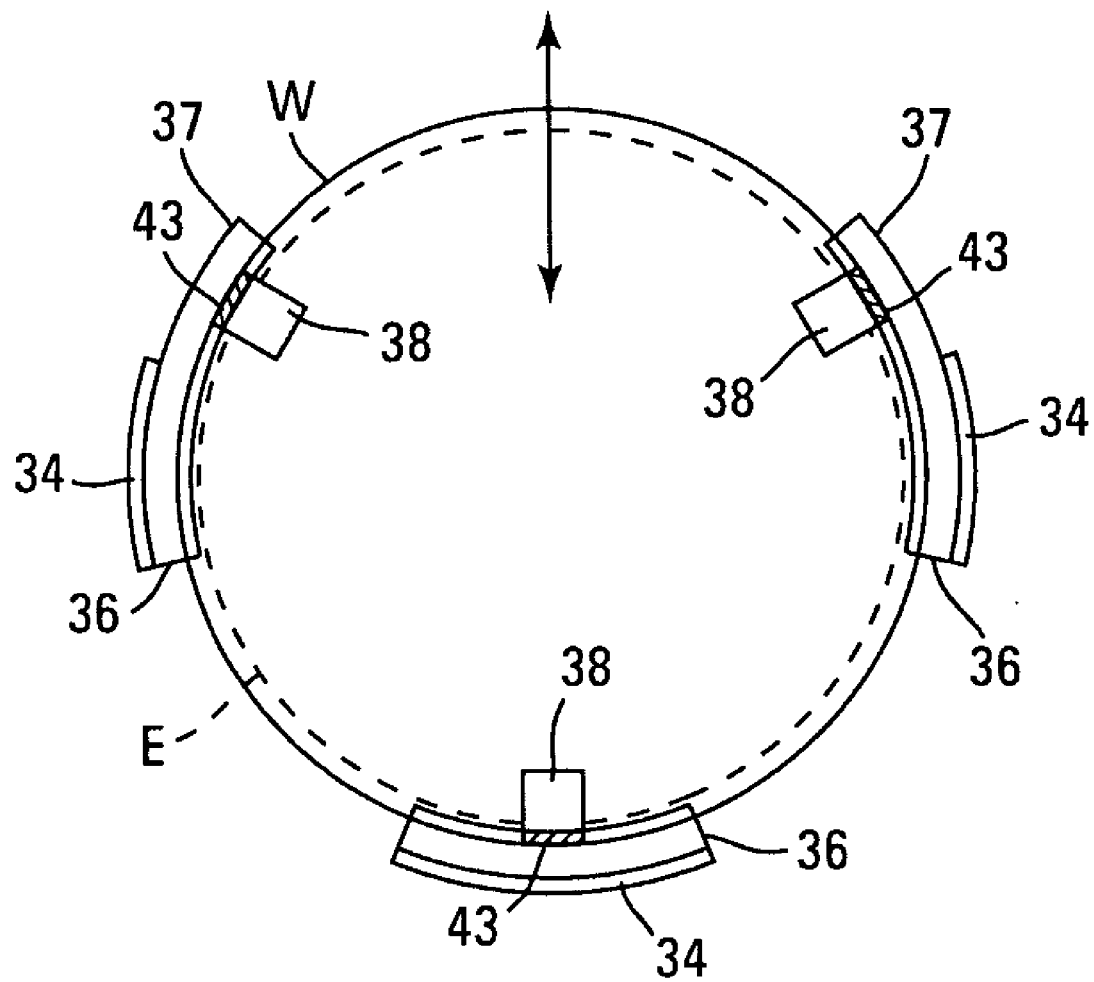
FIG. 6 is a schematic, bottom view of one embodiment of a wafer holding mechanism illustrating an arrangement of fingers for gripping a wafer.

The spacers 34 are spaced apart far enough to accept therebetween the lower plate 24. Furthermore, the spacers 22 are arranged in such a manner as to allow a wafer W to be inserted therebetween as shown in FIG. 3. In one embodiment of the wafer holding mechanism 20 best seen in FIG. 6, the upper plate 22 is provided with three spacers 34, two of which have lips 36 with projections 37 that cantilever forward to provide a support for the wafer W and to oppose the fingers 38. Note that the lips 36 may support a large portion of the periphery of the wafer W or may support the wafer W only in opposition to the fingers 38. In other embodiments, one or more spacers extending around varying portions of the periphery of the upper plate 22 may be used, so long as a wafer W may be inserted between the lips 36 that extend inwardly from the spacers 34 and the lower plate 24. Accordingly, in some embodiments, the wafer W may be clamped around substantially its entire periphery, at two points on its periphery, three points, four points and so on. One embodiment of a clamping scheme is illustrated in FIG. 6.

In one embodiment, the wafer W is clamped directly between the lips 36 and the lower plate 24. In other embodiments, such as those illustrated in the Figures, the lower plate 24 is provided with a number of fingers 38 that oppose the lips 36 to clamp the wafer W therebetween. In embodiments that incorporate fingers 38, the wafer W is clamped at discrete locations that are best characterized as points, as the contact area is generally limited. Multiple fingers 38 may be provided. Furthermore, lips 36 may be adapted to have limited surface area such that the lips 36 contact the wafer W over an area that is substantially the same as the contact area of the opposing finger 38.

Figure 5A:
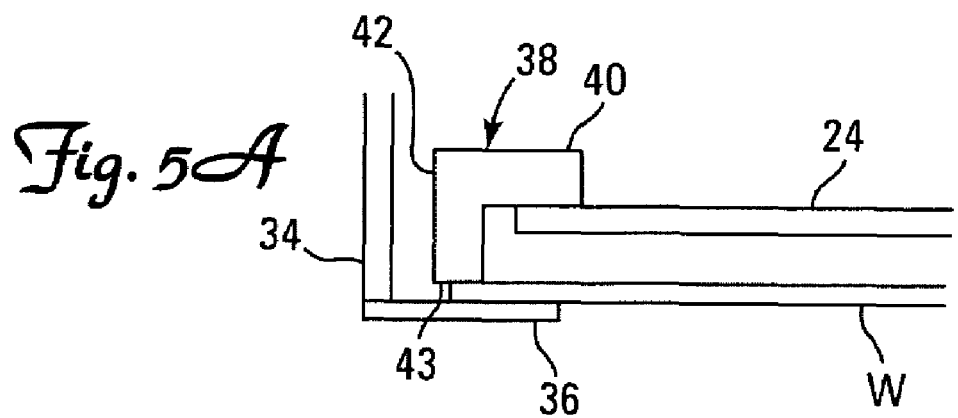
FIG. 5a illustrates one embodiment of a clamping finger of the wafer holding mechanism.
Figure 5B:
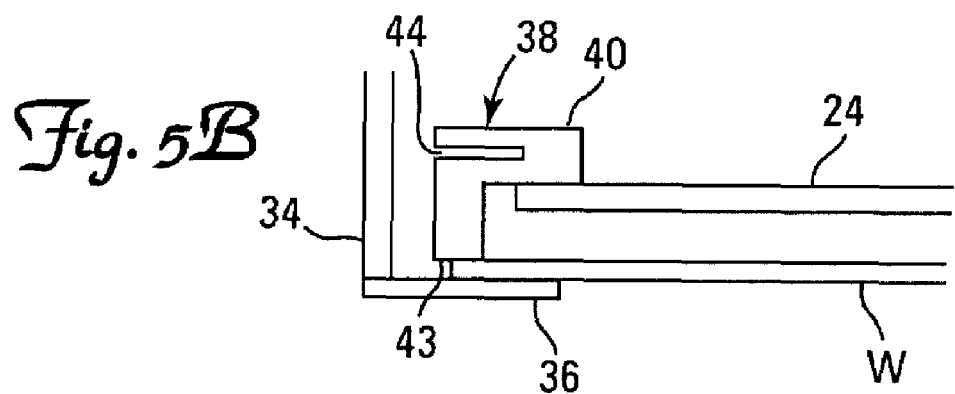
FIG. 5b illustrates a second embodiment of a clamping finger of the wafer holding mechanism.
Figure 5C:
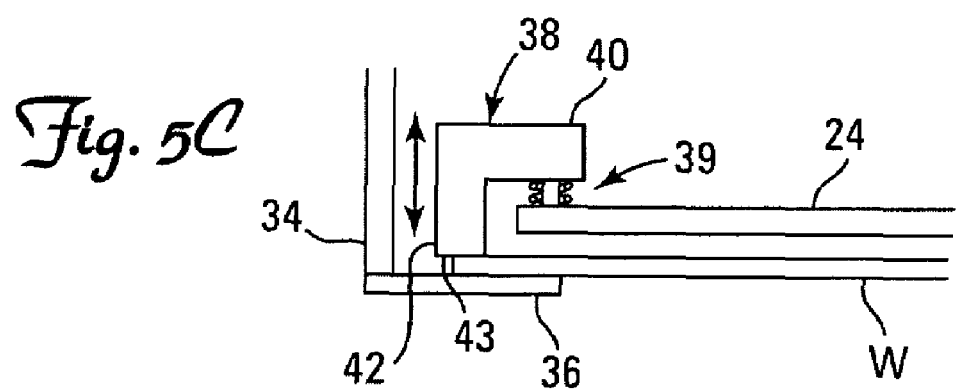
FIG. 5c illustrates a third embodiment of a clamping finger of the wafer holding mechanism.

FIGS. 5a-5c illustrate a few embodiments of fingers 38. Note that the fingers 38 may be adapted in other ways not pictured and accordingly, the invention is not limited to just those embodiments shown. FIG. 5a illustrates a solid embodiment of a finger 38. Each embodiment of finger 38 includes a base portion 40 that incorporates those structures necessary to couple the finger 38 to the lower plate 24, in some embodiments, a bore for a bolt or other fastener. A tip 42 extends downwardly from the base portion 40 and has a contact surface 43. The tip 42, and particularly the contact surface 43, may be planar, rounded, faceted or any other useful shape or size. Fingers 38 may be formed from materials such as ferrous or non-ferrous metals, plastics, and composite materials.

As it is desirable to limit the pressure applied to a wafer W by the fingers 38, in some embodiments, the position of the lower plate 24 with respect to a wafer W is carefully controlled so to limit the pressure applied. In other embodiments, the fingers 38 are adapted to have a predetermined resilience that, taken together with the size of the surface area of the contact surfaces 43 of the fingers 38, limit the amount of pressure applied to a wafer W. In one embodiment, the pressure applied to a wafer W is limited to approximately 37 ounces. The embodiment of finger 38 illustrated in FIG. 5a is a solid structure that may be formed of a relatively rigid material, in which case its application to the wafer W must be carefully controlled, or from a relatively resilient material, in which case, excessive force transmitted from the lower plate 24 to the fingers 38 is compensated for by an increase in the resilient deformation of the finger 38. FIG. 5b illustrates an embodiment of a finger 38 having a compliance slot 44 formed therein. Slot 44 limits the amount of force that tip 42 of finger 38 may apply by modifying the spring constant or inherent resiliency of the finger 38. As pressure is applied to the wafer W by the fingers 38, the fingers 38 will flex as a result of the slot 44, thereby limiting the pressure applied to the wafer W. In another embodiment best seen in FIG. 5c, an otherwise inflexible or solid finger 38 may be coupled to the lower plate 24 by a resilient structure 39 that allows relative motion between the finger 38 and the lower plate 24. Note that as the stress induced in a wafer W by a finger 38 is a product of the force applied to the fingers 38 by the lower plate 24 and the surface area of the contact surface 43, it is to be understood that, in general, the resiliency of a finger 38 may in some embodiments have an inverse relationship with the surface area of the contact surface 43. An additional benefit of using resilient or compliant fingers 38 is that if there is any misalignment between the plates 22 and 24, the resilient or compliant fingers may accommodate that misalignment while limiting pressure applied to the wafer W. Yet another benefit of the wafer holding mechanism 20 is that a wafer W is gripped in such a manner as to substantially eliminate relative motion between the plates 22 and 24 and a wafer W gripped therebetween.

The plates 22, 24 act to protect the upper surface of a wafer W clamped therebetween from particles that may fall from above the wafer holding mechanism 20. Furthermore, because the lower plate 24 is positioned relatively close to the upper surface of a wafer W while the wafer W is clamped between the plates, a stagnant air space that prevents or at least inhibits air flow over the upper surface of the wafer W is created between the lower plate 24 and the wafer W. This stagnant air space acts as a barrier to airborne particles and contaminants that might otherwise come to rest on the upper surface of the wafer W.

The lower plate 24 is supported and raised and lowered by a number of support columns 48 that pass through bores 50 formed through the upper plate 22. At least one support column 48 is required, though more are desirable. In one embodiment, the lower plate 24 is supported on three support columns 48. In order to ensure the smooth vertical movement of the support columns 48, and to minimize lateral movement of the columns, bores 50 may be provided with linear bearings or bushings 52. The tops of each of the support columns 46 are coupled to a control yoke 54. In applying vertical forces to the control yoke 54, the lower plate 24 may be made to move vertically with respect to the upper plate 22. In this manner, the clamping force needed to securely hold a wafer W between the upper and lower plates 22, 24 may be applied and released.

Figure 7:
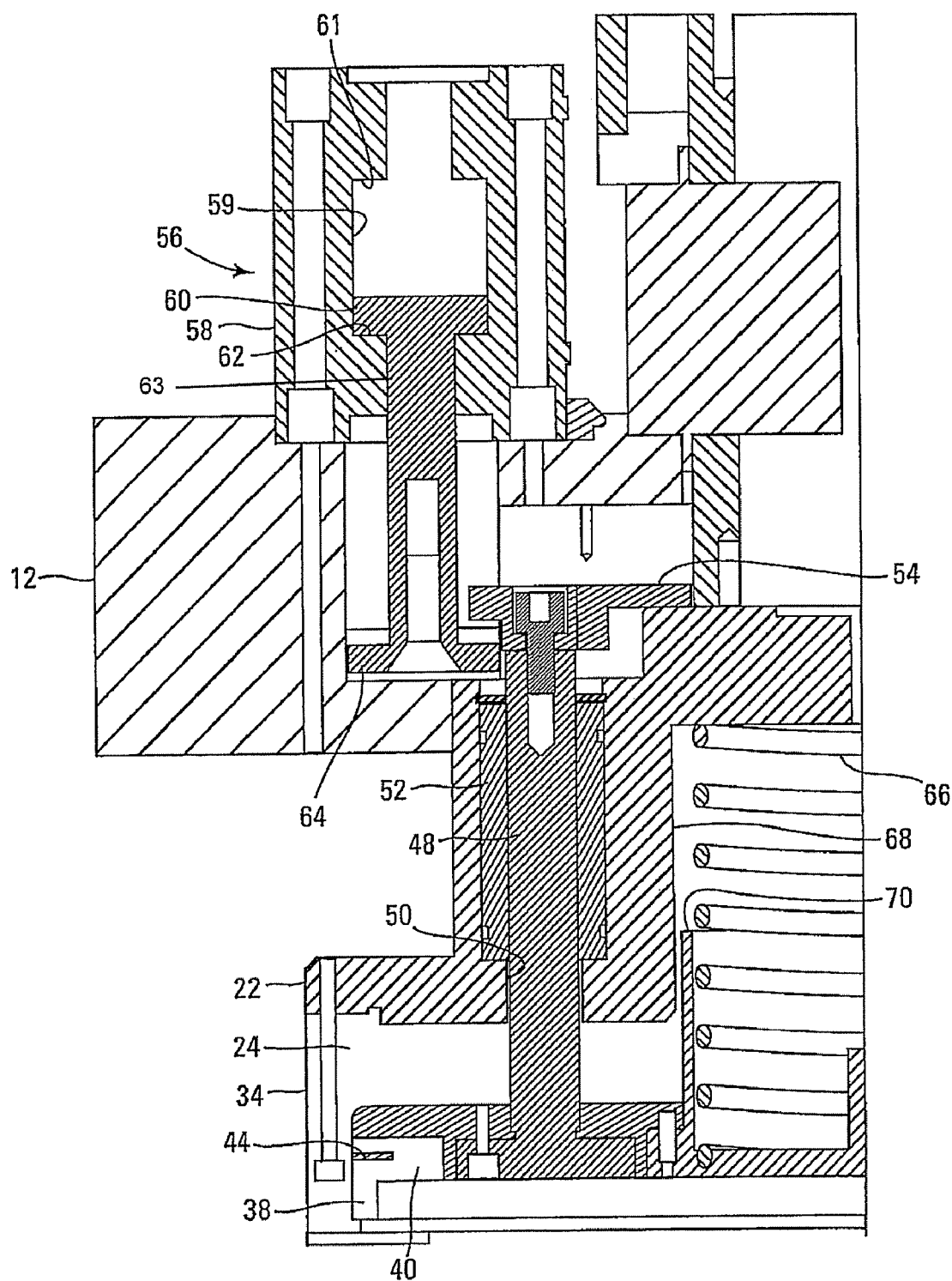
FIG. 7 is a schematic close-up cross-section of a portion of one embodiment of a wafer holding mechanism.

Forces are applied to the control yoke 54 by one or more actuators 56. Actuators 56 may be a double or single acting hydraulic or pneumatic cylinder, a solenoid, a ball screw mechanism or any other type of linear actuator known to those skilled in the art. In the embodiment shown in FIG. 2, the actuators 56 are single acting pneumatic cylinders. Each actuator has a body 58 with a bore 59 passed therethrough. A piston head 60 is received within the bore 59 and is reciprocable between an upper shoulder 61 and a lower shoulder 62 when pressurized air or other gasses are introduced into the bore 59 between the piston head 60 and the respective shoulders 61 and 62. A shaft 63 attached to the piston head 60 transmits motive power from the actuator 56 to the control yoke 54. The shafts 63 have a retaining washer 64 attached thereto that engages the control yoke 54 in such a manner as to allow upward forces to be applied thereto without limiting the rotation of the control yoke 54, as the control yoke 54 rotates with the upper and lower plates 22, 24, whereas the actuators 56 are generally fixed to the chassis 12 of the system 10. As will be appreciated, in a preferred embodiment, the control yoke 54 is ring-shaped, though in FIG. 7, only a cross section of the yoke 54 is seen.

In one embodiment, a spring 66 is positioned between the upper and lower plates 22, 24 to bias the lower plate 22 toward and into its lower, closed position. As a result, even if there is a power failure and the system 10 shuts down, the wafer W will remain securely clamped between the upper and lower plates 22, 24. Note that actuators 56 may be similarly spring loaded (not shown) to augment the action of spring 66 or to replace spring 66 in those embodiments where spring 66 is omitted. In some embodiments, upper plate 22 is provided with a generally cylindrical housing 68 that at least partially encloses a portion of the spring 66. Similarly, in some embodiments, the lower plate 24 may include a generally cylindrical housing 70 for at least partially enclosing a portion of the spring 66. In some of the aforementioned embodiments, the respective housings 68 and 70 of the upper and lower plates will telescopically mate to completely enclose the spring 66. In other embodiments, the housings 68 and 70 will only partially telescopically mate.

In one embodiment, the wafer holding mechanism 20 is supported and rotated by a drive mechanism 80 best seen in FIG. 4. The drive mechanism 80 includes an air bearing 82 that is coupled directly to an upper surface of the upper plate 22. An integral motor 84 is coupled to an upper surface of the air bearing 82. An air supply (not shown) is coupled to the air bearing to support the wafer holding mechanism 20 and to facilitate its smooth rotation. Rotational power is translated from the integral motor 84, which is in one embodiment a brushless electric motor, through the air bearing 82, to the upper plate of the wafer holding mechanism 20.

In one embodiment, the integral motor 84 includes a rotor 86 to which are secured one or more permanent magnets 87. Rotor 86 is positioned within a stator 88, which has disposed therein one or more coils 89 that are electrically connected to a power supply. Coils 89 are selectively energized to interact with the magnets 87 of the rotor so as to impart rotary motion thereto. One benefit of coupling the wafer holding mechanism 20 to a source of rotary motive power through an air bearing is that very little vertical motion is imposed on the wafer holding mechanism 20. As a result, a wafer W held in the mechanism 20 will be subject to minimal vertical forces that can deflect the wafer.

The rotary position of the wafer holding mechanism 20 in the embodiment illustrated in FIG. 4 is determined directly by a rotary encoder 30 of the type described in conjunction with the embodiment illustrated in FIGS. 2 and 3. Specifically, a read head 31a is coupled to the stator 88 of the integral motor 84 so as to engage an encoding ring 31b coupled to the rotor 86.

In use, the wafer holding mechanism 20 starts in an open position as shown in FIG. 2. In this position, the lower plate 24 has moved closer to upper plate 22, thereby moving fingers 38 away from lips 36. As a result, a wafer W may be inserted between fingers 38 and lips 36 by an wafer handling or transfer mechanism H or by an operator. Once the wafer W is in a desired position between the upper and lower plates 22, 24, the lower plate 24 is actuated to move from its open position to a closed position as seen in FIG. 3. In FIG. 3, the wafer W is clamped between the fingers 38 of the lower plate 24 and the lips 36 of the upper plate 22 in a predetermined number of locations depending on the nature and number of fingers 38 and lips 36. Note that the wafer W is in most embodiments clamped only in what was referred to above as the 'edge exclusion zone' of the wafer W (labeled as 'E' in FIG. 6), though it is possible to construct and arrange the lips 36 and fingers 38 to clamp a wafer W outside of this zone.

Once the wafer W has been clamped between the plates of the wafer holding mechanism 20, the mechanism 20 is rotated with respect to an imaging mechanism 100 that images the entire surface of the wafer W, in this embodiment, the undersurface or backside of the wafer W. It is to be understood that by simply reorienting the wafer holding mechanism 20, it is also possible to gain access to and image the upper surface of a wafer W. In one embodiment, the imaging mechanism 100 includes an area scan camera and an associated optical train, and in other embodiments, the imaging mechanism 100 includes a line scan camera and an associated optical train. In some embodiments, the imaging mechanism 100 moves radially with respect to the wafer W as the wafer W spins. In other embodiments, the imagining mechanism 100 will remain stationary as the wafer W spins.

The wafer holding mechanism 20 and the wafer W clamped therein are rotated by the drive 29 or 80 as described hereinabove or by another source of rotary power of a type known to those skilled in the art. Rotary encoder 30 tracks the rotary position of the wafer W and coordinates this position with the images captured by the imaging mechanism 100. Note that images of the wafer's surface may be inspected or examined individually or may be stitched or otherwise amalgamated into a larger image of the wafer backside for review of the entire surface at one time. Furthermore, such inspection may take place within the system 10 on controller 16 or may take place remotely, after data relating to the images captured by the imaging system 100 are transferred to a remote computer or other processing device.

CONCLUSION

Although specific embodiments of the present invention have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A wafer holding mechanism comprising:
   a first plate having at least one spacer secured thereto, the at least one spacer extending away from the first plate and having at least one lip extending radially inwardly from a distal end thereof;
   a second plate having at least one finger coupled thereto, the second plate being generally in planar parallel relationship with the first plate and positioned generally between the at least one lip of the spacer and the first plate, the distance between the at least one lip and the first plate being such as to permit the second plate to move relative to the first plate, the at least one finger being positioned on the second plate such that when the second plate is in an open position with respect to the first plate, the at least one finger will be positioned away from the at least one lip, and when the second plate is in a closed position with respect to the first plate, the at least one finger and the at least one lip will cooperatively grip a predetermined portion of a wafer therebetween.

2. The wafer holding mechanism of claim 1 wherein the second plate is positioned sufficiently close to the wafer clamped between the first and second plates that there is created therebetween a substantially stagnant air space.

3. The wafer holding mechanism of claim 1 further comprising:

a drive mechanism coupled to the first plate for rotating the wafer holding mechanism.

4. The wafer holding mechanism of claim 3 wherein the drive mechanism further comprises a motor coupled to the first plate.

5. The wafer holding mechanism of claim 4 wherein the motor is coupled to the first plate by an air bearing.

6. The wafer holding mechanism of claim 4 wherein the motor comprises a brush less electric motor.

7. The wafer holding mechanism of claim 1 wherein the second plate has coupled thereto at least one column, the at least one column being passed through at least one bore in the first plate, the at least one column and the bore being constructed and arranged to permit the at least one column to linearly reciprocate within the at least one bore, the at least one column having a distal end opposite the end thereof coupled to the second plate that is coupled to a yoke, the yoke being constructed and arranged to engage an actuator, the movement of the actuator being transferred through the yoke and at least one column to the second plate, the actuator being adapted to actuate the second plate between its open and closed positions.

8. The wafer holding mechanism of claim 7 wherein the second plate is coupled to the yoke by at least two columns.

9. The wafer holding mechanism of claim 7 wherein the yoke is adapted to engage the actuator regardless of the rotary position of the wafer holding mechanism.

10. The wafer holding mechanism of claim 7 wherein the actuator is at least two cylinders, the at least two cylinders being coupled to a structure that is stationary with respect to the wafer holding mechanism.

11. The wafer holding mechanism of claim 10 wherein the at least two cylinders are one of an hydraulic cylinder and a pneumatic cylinder.

12. The wafer holding mechanism of claim 7 wherein the actuator is biased into a first position which allows for the second plate to be biased toward its closed position by a biasing mechanism that is coupled to the second plate.

13. The wafer holding mechanism of claim 1 comprising three fingers adapted to grip the wafer at locations spaced approximately 120° from one another.

14. The wafer holding mechanism of claim 1 wherein the at least one finger is a solid structure.

15. The wafer holding mechanism of claim 1 wherein the at least one finger is a solid structure having a slot formed therein such that a portion of the at least one finger that includes a contact surface may resiliently deform when the contact surface of the at least one finger contacts a wafer.

16. The wafer holding mechanism of claim 1 wherein the at least one finger is resiliently coupled to the second plate such that the at least one finger may move with respect to the second plate when the at least one finger comes into contact with the wafer.

17. The wafer holding mechanism of claim 1 wherein the at least one finger is adapted to resiliently limit the magnitude of pressure applied to a wafer when the second plate is in its closed position.

18. The wafer holding mechanism of claim 17 wherein the resilient nature of the at least one finger is such as to limit pressure applied to the wafer by the at least one finger to at most 37 ounces.

19. The wafer holding mechanism of claim 1 further comprising a biasing mechanism coupled to at least one of the first and second plates for biasing the second plate toward its closed position.

20. The wafer holding mechanism of claim 19 wherein the biasing mechanism is a spring positioned between the first and second plates.

21. The wafer holding mechanism of claim 1 wherein the at least one finger is adapted to resiliently accommodate a predetermined amount of misalignment between the first and second plates when the second plate is in its closed position.

22. The wafer holding mechanism of claim 1 wherein the first plate is oriented generally above the second plate.

23. The wafer holding mechanism of claim 1 wherein the wafer holding mechanism grasps a wafer and maintains it in a generally horizontal orientation.

24. The wafer holding mechanism of claim 1 wherein the at least one finger and the at least one lip grip the wafer in a manner characterized by substantially no relative motion between the wafer and the at least one finger and at least one lip.

25. The wafer holding mechanism of claim 1 wherein the at least one finger includes a wafer contact surface that contacts only an edge exclusion zone of the wafer when the second plate is in its closed position.

26. The wafer holding mechanism of claim 1 wherein a wafer gripped by the wafer holding mechanism is supported only within an edge exclusion zone of the wafer.

27. A wafer holding mechanism comprising an upper gripping member and a lower gripping member, the upper and lower gripping members having a first, open position and a second, closed position, the upper and lower gripping members being adapted to receive a wafer when in their first, open position and to grip the edges of the wafer within an edge exclusion zone of the wafer in a manner such that there is no relative motion between the wafer and the gripping members when the wafer is clamped therebetween, the upper and lower gripping members being further adapted such that substantially the entire area of one surface of the wafer is available to be addressed to an inspection mechanism, including at least a portion of the edge exclusion zone of the wafer, the upper and lower gripping members being further constructed to grip the wafer at three locations at approximately 120° from one another, wherein the upper and lower gripping members comprise respectively:

a first plate having at least one spacer secured thereto, the at least one spacer extending away from the first plate and having at least one lip extending radially inwardly from a distal end thereof; and a second plate having at least one finger coupled thereto, the second plate being generally in planar parallel relationship with the first plate and positioned generally between the at least one lip of the spacer and the first plate, the distance between the at least one lip and the first plate being such as to permit the second plate to move relative to the first plate, the at least one finger being positioned on the second plate such that when the second plate is in an open position with respect to the first plate, the at least one finger will be positioned away from the at least one lip, and when the second plate is in a closed position with respect to the first plate, the at least one finger and the at least one lip will cooperatively grip a predetermined portion of a wafer therebetween.

* * * * *

UNITED STATES PATENT AND TRADEMARK OFFICE
CERTIFICATE OF CORRECTION

| | |
|---|---|
| PATENT NO. | : 7,703,823 B2 |
| APPLICATION NO. | : 11/179058 |
| DATED | : April 27, 2010 |
| INVENTOR(S) | : Mark Harless et al. |

Page 1 of 1

It is certified that error appears in the above-identified patent and that said Letters Patent is hereby corrected as shown below:

Column 9, line 14, before "bore" please insert -- at least one --.

Signed and Sealed this

Twenty-ninth Day of June, 2010

David J. Kappos
*Director of the United States Patent and Trademark Office*